United States Patent [19]
Remington et al.

[11] Patent Number: 4,979,145
[45] Date of Patent: Dec. 18, 1990

[54] STRUCTURE AND METHOD FOR IMPROVING HIGH SPEED DATA RATE IN A DRAM

[75] Inventors: Scott Remington; William L. Martino, Jr., both of Austin, Tex.

[73] Assignee: Motorola, Inc., Schaumburg, Ill.

[21] Appl. No.: 858,326

[22] Filed: May 1, 1986

[51] Int. Cl.⁵ .............................................. G06F 12/06
[52] U.S. Cl. .................................. 364/900; 364/957; 364/958.5
[58] Field of Search ... 364/200 MS File, 900 MS File; 365/189, 221, 230

[56] References Cited

U.S. PATENT DOCUMENTS

| | | | |
|---|---|---|---|
| 4,418,399 | 11/1983 | Sakurai | 365/51 |
| 4,503,522 | 3/1985 | Etoh et al. | 365/203 |
| 4,532,613 | 7/1985 | Takemae et al. | 365/230 |
| 4,569,036 | 2/1986 | Fujii et al. | 365/230 |
| 4,596,001 | 6/1986 | Baba | 365/189 |
| 4,608,666 | 8/1986 | Uchida | 365/182 |
| 4,630,240 | 12/1986 | Poteet et al. | 365/189 |
| 4,635,233 | 1/1987 | Matsumoto et al. | 365/230 |
| 4,660,178 | 4/1987 | Hardee et al. | 365/189 |
| 4,689,741 | 8/1987 | Redwine et al. | 364/200 |
| 4,729,118 | 3/1988 | Gelsomini | 365/230 |

Primary Examiner—David Y. Eng
Attorney, Agent, or Firm—James L. Clingan, Jr.

[57] ABSTRACT

A dynamic random access memory has a bit of data selected by a multiplexed address. The row address latches twice as much data as can be selected by the column address which follows the row address. After the column address has been utilized, there is still a one of two selection between two bits of data required. One of the row addresses provides the final selection between the two bits of data. An array toggle signal available from an extra pin is used to switch the state of the internal signal which corresponds to the one row address signal which makes the final one of two selection. The array toggle signal thus makes it possible to access any of the latched data in a high speed mode in which only the column address is changed to select among the bits of data which are already latched.

19 Claims, 3 Drawing Sheets

| | | | |
|---|---|---|---|
| DI | 1 | 18 | V$_{SS}$ |
| *W | 2 | 17 | DO |
| *RAS | 3 | 16 | *CAS |
| AT | 4 | 15 | A9 |
| A0 | 5 | 14 | A8 |
| A1 | 6 | 13 | A7 |
| A2 | 7 | 12 | A6 |
| A3 | 8 | 11 | A5 |
| V$_{DD}$ | 9 | 10 | A4 |

*FIG. 3*

STRUCTURE AND METHOD FOR IMPROVING HIGH SPEED DATA RATE IN A DRAM

FIELD OF THE INVENTION

The present invention relates to memories which receive a multiplexed address, and more particluarly, to memories which have a mode for providing data at a high speed.

BACKGROUND OF THE INVENTION

In standard dynamic random access memories (DRAMs), there are two portions to the address which are received sequentially. A row address is followed by a column address. The DRAM receives a row address strobe (*RAS) at a logic low to indicate that the row address is valid. Some time later the column address is valid. The column address can either be clocked by a column address signal (*CAS) switching to a logic low or by a predetermined delay following signal *RAS switching to a logic low. After signal *RAS switches to a logic low, the DRAM latches data along a selected row in sense amplifiers at the ends of the columns. The column address then determines which column provides the data as the output.

In order to provide data at a faster rate, modes of operation have been developed to take advantage of the data that is latched in response to the row address. One way this is achieved is by sequentially providing column addresses without any intervening row address. The DRAM knows that it is receiving column addresses only by signal *RAS being held to a logic low. There are two techniques for providing data to column only addresses. A clocked static column mode responds to the column address upon signal *CAS switching to a logic low and then outputs the corresponding data a predetermined delay time following signal *CAS switching to a logic low. A transparent static column mode DRAM continuously responds to the address as a column address and provides the data in response to signal *CAS switching to a logic low so that signal *CAS is used merely as an output enable signal.

Both of these modes provide for improved speed over a normal cycle because there is no row address cycle. The limitation, however, is that of the number of column address signals. The amount of latched data may in fact be greater than the selection available from the column address alone. For example, in the case of a 1 megabit (1,048,576 bits) DRAM, there are 2 sets of 10 address bits sequentially received. Each set can perform a one of 1024 selection. Consequently, the 10 bit column address can only select from 1024 bits of data. There may, however be more than 1024 bits of data that are latched. This is particularly true in a 1 megabit DRAM that must meet a 512 cycle refresh specification. To meet a 512 cycle refresh requirement, the DRAM must refresh every memory location with 512 row cycles. In order to achieve a 512 cycle refresh, 2048 memory locations must be refeshed for each unique row address. This implies that 2048 bits of data are latched for each unique row address. One of the bits in the row address is used to define which latch location is output as data. There are thus 2048 bits of latched data which are available for rapid output. The 10 column address bits, however, can only define 1024 locations.

SUMMARY OF THE INVENTION

An object of the present invention is to provide an improved DRAM.

Another object of the invention is to provide an improved high speed data mode in a DRAM.

Yet another object of the invention is to increase the data available for accessing during a high speed data mode.

These and other objects are achieved in a read/write memory having a set of memory cells in which a memory cell is selected by a first plurality of address signals, a second plurality of address signals, and a control address signal. The memory has first, second, and third decoders, and a control circuit. The first decoder selects a first subset of memory cells in response to the first plurality of address signals. The second decoder selects a first memory cell and a second memory cell from the first subset of memory cells in response to the second plurality of address signals. The third decoder selects between the first memory cell and the second memory cell in response to an internal address signal. The control circuit provides the internal address signal at a logic state which is the same as a logic state of the control address signal when an array toggle signal is in a first logic state and provides the internal address signal at a logic state which is opposite that of the control address signal when the array toggle signal is in a second logic state.

BRIEF DESCRIPTION OF THE DRAWINGS

FIG. 3 is a pinout of the memory of FIG. 1 according to a preferred embodiment of the invention.

DESCRIPTION OF THE INVENTION

Figure 1A:
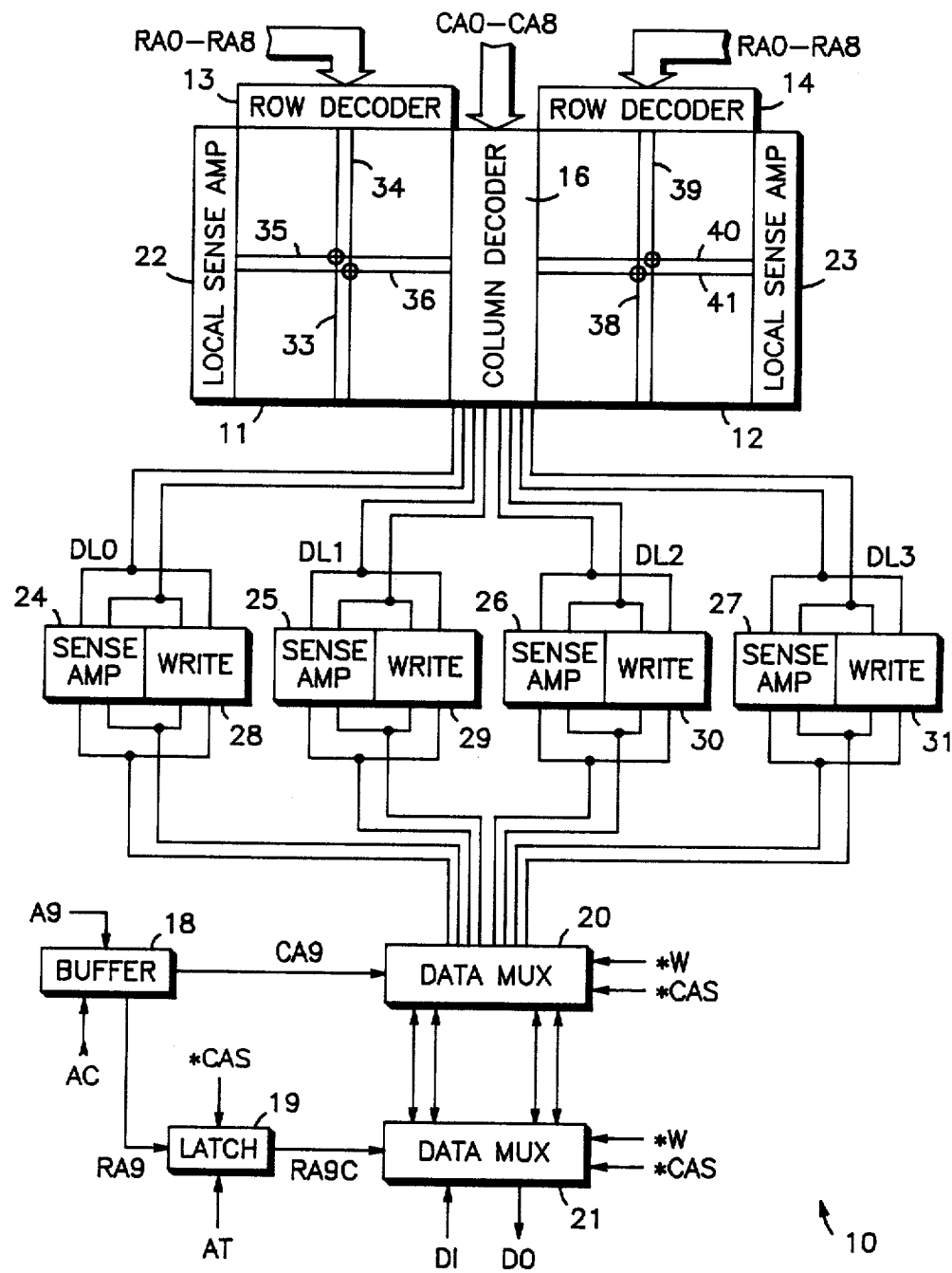
FIG. 1A is a block diagram of a first portion of a memory according to a preferred embodiment of the invention.
Figure 1B:
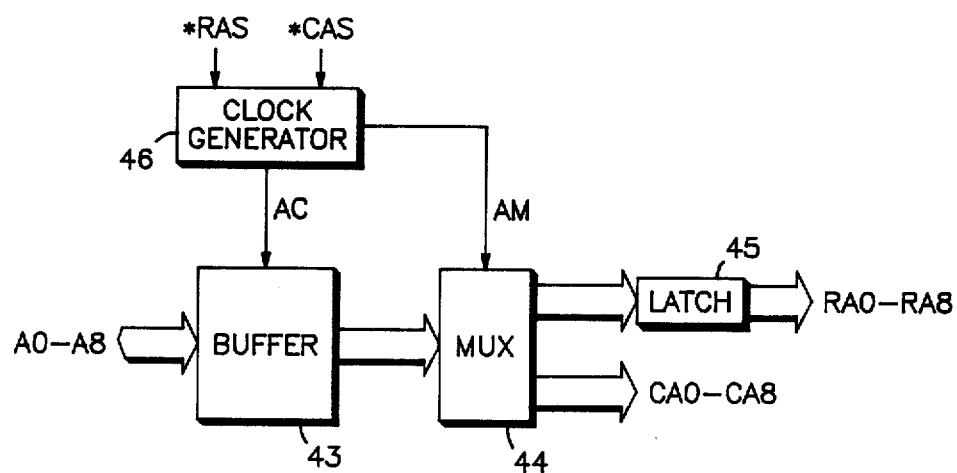
FIG. 1B is a block diagram of a second portion of the memory of FIG. 1A.

Shown in FIGS. 1A and 1B is a dynamic random access memory (DRAM) 10 comprised generally of a left array 11, a right array 12, a left row decoder 13, a right row decoder 14, a column decoder 16, an A0-A8 address buffer 17, an A9 address buffer 18, a latch 19, a data multiplexor 20, a data multiplexor 21, left local sense amplifiers 22, right local sense amplifiers 23, a D0 sense amplifier 24, a D1 sense amplifier 25, a D2 sense amplifier 26, and a D3 sense amplifier 27, a D0 write driver 28, a D1 write driver 29, a D2 write driver 30, and a D3 write driver 31. Left array 11 contains 524,288 addressable DRAM cells coupled to word lines and bit line at corresponding intersections thereof. Right array 12 contains 524,288 addressable DRAM cells coupled to word lines and bit line at corresponding intersections thereof. Shown in FIG. 1 are adjacent word lines 33 and 34 and adjacent bit lines 35 and 36 located in left array 11 and adjacent word lines 38 and 39 and adjacent bit lines 40 and 41 located in right array 12. Address buffer 17 is comprised of a buffer 43, a multiplexor 44, a latch 45, and a clock generator 46.

Address buffer 17 receives 9 externally provided address signals A0-A8 via buffer 43 and provides 9 internal row address signals RA0-RA8 via latch 45 and 9 internal column address signals CA0-CA8 via multiplexor 44 in response to signals A0-A8. Row address signals RA0-RA8 are determined when externally generated row address strobe signal *RAS switches to a logic low. The asterisk (*) in front of a signal indicates that the signal is active at a logic low. Address buffer 17 latches the state of address signals A0-A8 in latch 45 in response to signal *RAS switching to a logic low. These latched signals are provided as signals RA0-RA8 to row decoders 13 and 14. Clock generator 46 provides an address clock signal AC and an address multplex signal AM as timing signals for determining when signals A0-A8 are interpreted as column address signals and provided as signals CA0-CA8.

Memory 10 can be either a transparent static column DRAM or a clocked static column DRAM. Both types are well known. Clock generator 46 is changed slightly but the remainder of memory 10 is the same in either case. The circuit changes are made with a single mask option. Memory 10 is made with two layers of polysilicon and two layers of metal. Only the second layer of metal need be changed to convert between a transparent and a clocked static column part. Consequently, either option is available from DRAM 10 shown in FIGS. 1A and 1B.

Figure 2:
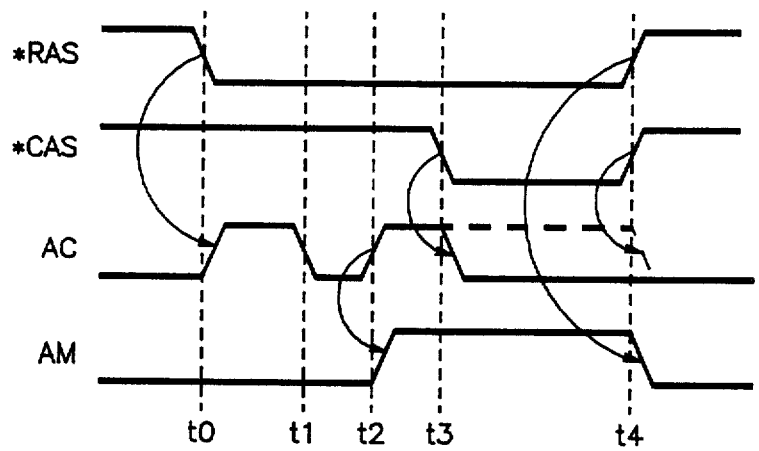
FIG. 2 is a timing diagram of signals used in the memory of FIG. 1.

Shown in FIG. 2 is a timing diagram of signals AC and AM as derived from a row address strobe signal *RAS and a column address strobe signal *CAS. Prior to the beginning of a cycle, signals *CAS and *RAS are at a logic high. A cycle begins with signal *RAS switching to a logic low shown as a time t0. Clock generator 46 responds by causing signal AC to switch to a logic high. A predetermined time later, approximately 15 nanoseconds (ns), clock generator 46 switches signal back to a logic low at a time t1. Another predetermined time duration later, approximately 10 ns, clock generator 46 switches signal AC to a logic high at a time t2. in response to signal AC switching to a logic high at time t2, signal AM is switched to a logic high. When signal *CAS switches to a logic low at a time t3, signal AC switches to a logic low in the case of a DRAM 10 being a clocked static column DRAM but remains at a logic high in the case of DRAM 10 being a transparent column DRAM. The dotted line portion shown in FIG. 2 of the representation of signal AC shows the transparent static column case. In the transparent static column case, signal AC switches to a logic low in response to signal *CAS switching to a logic high at a time t4. Signals *CAS and *RAS switching to a logic high prepares DRAM 10 for another cycle. When signal AC is a logic high, buffer 43 receives address signals A0-A8 and outputs the logic states thereof to multiplexor 44. When signal AC switches to a logic low, address signals A0-A8 are blocked. Buffer 43, however, includes a latch so that the last logic states of signals A0-A8 are latched and output to multiplexor 44. Multiplexor outputs the logic states received from buffer to latch 45 when signal AM is a logic low. Latch 45 provides the logic states latched therein as signals RA0-RA8. When signal AM is a logic high, multiplexor 44 provides the output of buffer 43 as signals CA0-CA8.

In the case of a clocked static column DRAM, the operation when both a column and a row address change is virtually the same as a conventional NMOS DRAM. In response to signal *CAS switching to a logic low, the logic state of signals A0-A8 are latched and provided as signals CA0-CA8 so that signals CA0-CA8 are not responsive to signals A0-A8 while signal *CAS is a logic low. This is the case for signal AC being shown represented as a solid line between time t3 and time t4. In the case of DRAM 10 being a transparent static column DRAM, buffer 18 continues to be responsive to address signals CA0-CA8. This is the case in which signal AC remains at a logic high after signal *CAS has switched to a logic low as shown by the dotted line representation of signal AC shown in FIG. 2. While signal AC is a logic high, buffer 43 is responsive to address signals A0-A8 which in turn implies that column address signals CA0-CA8 continue to be responsive to address signals A0-A8. In either the transparent or clocked static column case, signal *CAS operates as an output enable. A data output signal DO is provided as representing the data of the selected memory cell when signal *CAS is a logic low but as a high impedance when signal *CAS is a logic high. So long as the column address does not change for a sufficient period of time following signal *RAS switching to a logic low, signal DO will be valid at the time signal *CAS switches to a logic low. If the column address changes too soon before signal *CAS switches to a logic low or if signal *CAS switches to a logic low too soon following signal *RAS switching to a logic high, signal DO will not be immediately valid upon signal *CAS switching to a logic low. There is a minimum amount of time required following a column address change for DRAM 10 to provide valid data.

The row address comprised of row address signals RA0-RA8 is received by left row decoder 13 and right row decoder 14. Signals RA0-RA8 select a word line from each of left array 11 and right array 12 to be enabled by row decoders 13 and 14, respectively. Folded bit lines are used in arrays 11 and 12. For each selected word line, alternate bit lines have data supplied thereto by memory cells connected to the enabled word line. A bit line which is adjacent to the bit line which has an enabled memory cell connected thereto is used for a reference for establishing a voltage differential between it and the adjacent bit line. For example, assume that word line 33 is enabled and a memory cell is connected to word line 33 and intersecting bit line 35. In such case, adjacent bit line 36 does not have a memory cell which is connected to it and to word line 33. On the other hand, word line 34 has a memory cell connected to bit line 36 but not to bit line 35. When word line 33 is enabled, bit line 35 receives an output from the memory cell connected at the intersection of word line 33 and bit line 35 and bit line 36 is used as a reference so that a voltage differential is established between bit lines 35 and 36. Bit lines 35 and 36 form a pair of bit lines which are coupled to a particular one of local sense amplifiers 22. There is a particular local sense amplifier corresponding to each pair of adjacent bit lines.

Each of local sense amplifiers 22 and 23 performs a refresh function for each time a word line is enabled which is the conventional way DRAMs operate. Each of local sense amplifiers 22 and 23 is latched a predetermined time delay after a word line from each of arrays 11 and 12 has been enabled. Each of local sense amplifiers 22 and 23 thus is latched to a state representative of the state of the memory cell which was enabled by the enabled word line. There are a total of 1024 local sense amplifier circuits in local sense amplifiers 22 and another 1024 local sense amplifier circuits in local sense amplifiers 23.

The column address comprised of signals CA0-CA8 is received by column decoder 16. Column decoder 16 selects two bit line pairs from array 11 and two bit line pairs from array 12 for coupling to data line pairs DL0, DL1, DL2, and DL3, respectively. Address signals CA0–CA8 determine which four bit line pairs are selected Signals RA9C and CA9 determine which one of the four bit line pairs actually provide the single bit of data. Data line pair DL0 is connected to sense amplifier 24 and to write circuit 28. Data line pair DL1 is connected to sense amplifier 25 and write circuit 29. Data line pair DL2 is connected to sense amplifier 26 and write circuit 30. Data line pair DL3 is connected to sense amplifier 27 and write circuit 31. In the read mode of DRAM 10, which is when signal *W is a logic high, sense amplifiers 24–27 detect the logic state of data line pairs DL0, DL1, DL2, and DL3. In the write mode of DRAM 10, which is when signal *W is a logic low, a selected one of write circuits 28–31 writes data onto the data line pair to which it is connected.

For the case in which DRAM 10 is a clocked static column DRAM, column address signals CA0–CA8 are latched in response to signal *CAS switching to a logic low. Signal CA9 is also latched while signal *CAS is a logic low. Consequently, while signal *CAS is a logic low, the selected memory location cannot be changed. If DRAM 10 is in the read mode, data multiplexer 21 selects one of sense amplifiers 24–27 for driving output signal DO. The sense amplifier selection is achieved with column address signal CA9 and control row address signal RA9C. Signal RA9C is a function of the state of signal A9 at the time signal *RAS switches to a logic low and of the state of externally provided array toggle signal AT. For the operation of DRAM 10 when both the row and column addresses change every cycle, signal AT will be held to a logic high. When signal AT is held to a logic high, latch 19 provides signal RAC9 at the same state as the state of signal RA9 which is supplied in nearly the same way as row address signals RA0–RA8.

Signals CA9 and RA9C provide data multiplexors 20 and 21, respectively, with the information necessary to perform the one of four selection between sense amplifiers 24–27. Signal CA9 is received by data multiplexor 20. When signal CA9 is in one logic state, data lines D0 and D2 are selected by multiplexor 20. When signal CA9 is in the other logic state, data lines D1 and D3 are selected by data multiplexor 20. Signal RA9C is received by data multiplexor 21. When signal RA9C is in one logic state, one of the data pairs between multiplexors 20 and 21 is selected. When signal RA9C is in the other logic state the other data pair between multiplexors is selected. This has the effect of signal RA9C determining whether the data provided by DO represents data from left array 11 or right array 12. When signal RA9C is a logic high, one of sense amplifiers 24 or 25 will be selected. Selecting between sense amplifiers 24 or 25 implies selecting one of data lines DL0 or DL1. Both data lines DL0 and DL1 carry data from or to array 11. When signal RA9C is a logic low, one of sense amplifiers 26 or 27 will be selected This similarly implies a selection from one of data lines DL2 or DL3 and thus a selection from array 12. Whatever the state of signal RAC9, half of DRAM 10 becomes unaccessible.

After the 9 row address signals RA0–RA8 have selected a word line from each array 11 and 12, each set of local sense amplifiers 11 and 12 have 1024 bits of latched data so that there is a total of 2024 (2 to the 11th) bits of latched data. The total column address comprised of signals CA0–CA9 can select from only 1024 bits. The state of signal RA9C determines from which array, array 11 or array 12, the one of 1024 selection is made. It is already known that bits latched in response to signal *RAS switching to a logic low can be output relatively rapidly.

For a clocked static column DRAM, signal *CAS is switched back to a logic high in the normal fashion to end the data cycle in which signal *RAS had been switched to a logic low for one half of the address and signal *CAS had been switched to a logic low for the other half of the address. Instead of switching signal *RAS back to a logic high and then to a logic low to latch the row address, signal *RAS is kept at a logic low when signal *CAS is brought back to a logic high. The data remains latched in the local sense amplifiers with no change in the row address. The column address can be changed. The new column address is latched upon signal *CAS switching to a logic low and the new data is output. This takes advantage of the fact that data is already latched so that a data cycle can be run which deletes the time necessary to input the row address. This is also true for writing data. Of course the latched data in the local sense amplifiers is of advantage only in the read mode, but deleting the time to input the row address applies equally to both reading and writing.

For a transparent static column DRAM, both signal *RAS and *CAS are held to a logic low. After signal *RAS has switched to a logic low and the row address has been latched, any address after that is interpreted as a column address. Signal *CAS switching to a logic low enables the output but does not render signals CA0–CA8 unresponsive to changes in address signals A0–A8. As long as both signal *RAS and signal *CAS are a logic low, the column address can select new data. In the case of DRAM 10, signal DO will provide the data at the local sense amplifier selected by signals CA0–CA8 and at the data line pair selected by signals CA9 and RA9C. With *RAS at a logic low, signals CA0–CA9 are simply buffered external address signals A0–A9 performing a one of 1024 selection.

Latch 19 is used to provide for high speed operation for twice as many bits as was available in the prior art. In the prior art, the number of bits that could be rapidly output was limited to the number of bits selectable by the second half of the address. In the case of a one megabit DRAM, such as DRAM 10, the total number of address signals necessary to perform the one of 1,048,576 selection is 20. One half, 10, is clocked with signal *RAS switching to a logic low. The other half is of course also 10. Each set of 10 addresses provides for a one of 1024 selectability. DRAM 10 can be operated in the same manner as a prior art DRAM by keeping signal AT at a logic high. When signal AT is kept at logic high, latch 19 provides signal RA9C in the same state as signal RA9. When signal AT is a logic low at the time *CAS switches to a logic low, latch 19 responds by reversing the logic state of signal RA9C. Signal RA9C is brought back to its original state when signal AT is switched back to a logic high on the next *CAS cycle in the case of DRAM 10 being a clocked static column DRAM. In the case of DRAM 10 being a transparent static column DRAM, signal RA9C can be switched back and forth between logic states while signal *CAS is a logic low in response to signal AT.

In the case in which DRAM 10 is a transparent static column DRAM, latch 10 can switch the logic state of signal RA9C while *CAS is a logic low. While signal *CAS is a logic low, signal AT at a logic low will cause signal RA9C to be of the opposite logic state of that of signal RA9. This has the effect of signals CA0–CA9 selecting from the opposite array than that chosen by the original row address signal A9. Assume for example that signal A9 was a logic high when signal *RAS switched to a logic low so that signal RA9 was latched to a logic high. Assume also that signal RA9C at a logic high selects array 11. Under conventional operation, signal RA9C would be the same state as signal RA9 so that column address signals CA0–CA9 would make a one of 1024 selection from array 11. With signal AT at a logic low, signal RA9C is switched to the opposite state of that of signal RA9 so that signal RA9C is a logic low. With signal RA9C at a logic low, column signals CA0–CA9 are used to perform a one of 1024 selection from array 12. While signal *CAS and signal *RAS are a logic low, DRAM 10 will continue to respond to changes in column signals CA0–CA9. Similarly, signal RA9C responds to signal AT. When signal AT switches to a logic high, signal RA9C responds by assuming the same logic state as signal RA9. When signal AT switches to a logic low, signal RA9C responds by switching to the state opposite that of signal RA9. In this way 2048 bits become available for selection in the high speed data mode in which signals *RAS and *CAS are held to a logic low and the column address is changed. This is true for both reading and writing. For both reading and writing, signal AT is very similar to a column address signal. The difference is that instead of causing signal RA9C to become the same state as signal AT, signal AT selectively causes signal RA9C to become either the same logic state or the opposite logic state of signal RA9.

In the case of DRAM 10 being a clocked static column DRAM, latch 19 latches signal RA9C in response to signal *CAS switching to a logic low to a state related to the states of signals RA9 and AT. If signal AT is a logic high, the state of signal RA9C will be the same as that of signal RA9. If signal AT is a logic low when signal *CAS switches to a logic low, signal RA9C will be latched at the state opposite to that of signal RA9. For the clocked static column DRAM case, the column address is latched while signal *CAS is a logic low. Similarly, signal AT cannot change the state of signal RA9C after signal *CAS has switched to a logic low. In the clocked static column DRAM case, the rapid output of data is achieved by keeping signal *RAS at a logic low while clocking signal *CAS. To select a different location for providing data, signal *CAS must first be brought back to a logic high so that the column address can be changed. This is also true for signal AT. After signal *CAS is brought back to a logic high, the column address and signal AT can be changed. After the desired changes to signals A0–A9 and signal AT have been made, signal *CAS is then switched to a logic low. In response to signal *CAS switching to a logic low, new signals CA0–CA9 are latched and signal RA9C is latched in the state determined by signal AT and signal RA9. Signal AT can be changed between the times that signal *CAS switches to a logic low to switch the selection between array 11 and array 12. Signal AT thus is used to make available 2048 bits of data for the fast data rate mode of DRAM 10 as a clocked static column DRAM. This is true for either reading or writing.

In either the transparent or clocked static column DRAM case, in the fast data rate mode indicated by signal *RAS being held to a logic low, signal AT is used in virtually the same way as a column address signal. The difference is that signal AT causes the internal address signal controlled by signal AT, signal RA9C, to be the opposite of or the same as a row address signal, signal RA9, latched in response to signal *RAS switching to a logic low, whereas a column address signal causes its corresponding internal column address signal to be the same logic state as the column address signal itself.

The first portion of the row address, signals RA0–RA9, select 2048 memory cells via row decoders 13 and 14. These 2048 selected cells form a first subset of all of the memory cells which are available to be selected. Signals CA0–CA8, via column decoder 16, select 4 memory cells from the first subset of 2048 memory cells selected by signals RA0–RA8. These four selected memory cells form a second subset of memory cells. Signal CA9, via multiplexor 20, selects two cells from the second subset of memory cells selected by signals CA0–CA8. These two selected memory cells form a third subset of memory cells. Column decoder 16 and multiplexor 20 can be viewed as single decoder responsive to signals CA0–CA9. Signal RA9C, via multiplexor 21, selects one memory cell from the third subset of memory cells selected by signal CA9. This selected memory cell forms a fourth subset of memory cells. In response to signal AT, signal RA9C switches logic states so that the other of the memory cells from the third subset is selected. This alternately selected memory cell forms a fifth subset of memory cells and is disjoint from the fourth subset.

Shown in FIG. 3 is a layout of the pin configuration of DRAM 10 comprised generally of 18 pins. Pin 1 is for receiving data input signal DI. Pin 2 is for receiving the write enable signal *W. Pin 3 is for receiving signal *RAS. Pin 4 is for receiving array toggle signal AT. Pin 5 is for receiving address signal A0. Pin 6 is for receiving address signal A1. Pin 7 is for receiving address signal A2. Pin 8 is for receiving address signal A3. Pin 9 is a positive power terminal VDD for receiving a positive power supply voltage. Pin 10 is for receiving address signal A4. Pin 11 is for receiving address signal A5. Pin 12 is for receiving address signal A6. Pin 13 is for receiving address signal A7. Pin 14 is for receiving address signal A8. Pin 15 is for receiving address signal A9. Pin 16 is for receiving signal *CAS. Pin 17 is for providing data ouput signal DO. Pin 18 is a negative power supply terminal VSS for receiving a negative power supply, normally ground. All of the pins are conventional except pin 4. In a conventional one megabit DRAM, pin 4 is not connected.

We claim:

1. A read/write memory having a set of memory cells in which a memory cell is selected by a first plurality of address signals, a second plurality of address signals, and a control address signal, comprising:

first decoder means for selecting a first subset of memory cells from said set of memory cells in response to the first plurality of address signals;

second decoder means, coupled to the first decoder means, for selecting a first memory cell and a second memory cell from the first subset of memory cells in response to the second plurality of address signals;

third decoder means, coupled to the second decoder means for selecting between the first memory cell and the second memory cell in response to an internal address signal; and control means, coupled to the third decoder means, for providing the internal address signal at a logic state which is the same as a logic state of the control address signal when an array toggle signal is in a first logic state and for providing the internal address signal at a logic state which is opposite that of the control address signal when the array toggle signal is in a second logic state.

2. The memory of claim 1 wherein the set of memory cells is divided into a first array and a second array, wherein said memory cells are characterized as being coupled to word lines and bit lines at intersections thereof, and wherein the first decoder comprises:
a first row decoder for enabling a word line in the first array selected by the first plurality of address signals;
a second row decoder for enabling a word line in the second array selected by the first plurality of address signals, wherein the cells coupled to the word lines enabled by the first and second decoders comprise the first subset of memory cells;
first sense amplifier means, coupled to the second decoder, for latching data stored in the memory cells coupled to the enabled word line in the first array; and
second sense amplifier means for latching data stored in the memory cells coupled to the enabled word line in the second array.

3. The memory of claim 2, wherein the second decoder means selects the first and second memory cells by coupling data of the first and second memory cells which is latched in the first and second sense amplifier means from the first and second sense amplifier means to the third decoder means in response to the second plurality of address signals.

4. The memory of claim 3, wherein the second decoder means comprises:
a plurality of secondary sense amplifiers for receiving selected data from the first and second sense amplifier means and providing outputs with respect to the data received;
a column decoder for selecting a second subset of memory cells taken from said first subset of memory cells in response to a first portion of the second plurality of address signals and for coupling the data of the second subset of memory cells which is latched in the first and second sense amplifier means from the first and second sense amplifier means to the plurality of secondary sense amplifiers; and
a multiplexor, coupled to the outputs of the plurality of secondary sense amplifiers, for selecting the outputs of the plurality of secondary sense amplifiers representative of the first and second memory cells in response to a second portion of second plurality of address signals and for coupling the selected outputs of the plurality of secondary sense amplifiers to the third decoder means.

5. The memory of claim 4 wherein the second plurality of address signals are received after the first plurality of address signals and the control address signal, further comprising:
latch means for latching the first plurality of address signals and the control address signal in response to a row address strobe signal.

6. The memory of claim 1 wherein the second plurality of address signals are received after the first plurality of address signals and the control address signal, and wherein the control means is further characterized as latching the control address signal in response to a row address strobe signal, further comprising:
latch means for latching the first plurality of address signals in response to the row address strobe signal.

7. The memory of claim 6 divided into a first array and a second array in which memory cells are coupled to word lines and bit lines at intersections thereof, wherein the first decoder comprises:
a first row decoder for enabling a word line in the first array selected by the first plurality of address signals;
a second row decoder for enabling a word line in the second array selected by the first plurality of address signals;
first sense amplifier means, coupled to the second decoder, for latching data stored in the memory cells coupled to the enabled word line in the first array; and
second sense amplifier means for latching data stored in the memory cells coupled to the enabled word line in the second array.

8. A random access memory having a plurality of memory cells in which a memory cell is selected by a multiplexed address comprised of a first address of n signals comprised of (n−1) row signals and a row control signal, and a second address of n signals received after said first address is received, comprising:
latch means for latching data from 2 to the (n+1) memory cells in response to the (n−1) row signals from the first address;
column decoder means, coupled to the latch means, for selecting data from a first and a second memory cell latched by the latch means in response to the second address of n signals;
multiplex means for selecting the first memory cell in response to an internal address signal being in a first logic state and the second memory cell in response to the internal address signal being in a second logic state; and
control means for providing the internal address signal at a logic state responsive to that of the row control signal and for reversing the logic state of the internal address signal in response to receiving an array toggle signal.

9. The memory of claim 8 divided into a first array and a second array in which memory cells are coupled to word lines and bit lines at intersections thereof, wherein the latch means comprises:
a first row decoder for enabling a word line in the first array selected by the (n−1) row signals;
a second row decoder for enabling a word line in the second array selected by the (n−1) row signals;
first sense amplifier means, coupled to the column decoder, for latching data stored in the memory cells coupled to the enabled word line in the first array; and
second sense amplifier means, coupled to the column decoder, for latching data stored in the memory cells coupled to the enabled word line in the second array.

10. The memory of claim 9, wherein the column decoder selects the first and second memory cells by coupling data of the first and second memory cells which latched in the first and second sense amplifier means from the first and second sense amplifier means to the multiplex means in response to the second address of n signals.

11. The memory of claim 10, wherein the column decoder means comprises:
- a plurality of secondary sense amplifiers for receiving selected data from the first and second sense amplifier means and providing outputs with respect to the data received;
- column selector means for selecting a second subset of memory cells taken from said first subset of memory cells in response to a first portion of the second plurality of address of n signals and for coupling the data of the second subset of memory cells which is latched in the first and second sense amplifier means from the first and second sense amplifier means to the plurality of secondary sense amplifiers; and
- data selector means, coupled to the outputs of the plurality of secondary sense amplifiers, for coupling selected outputs of the plurality of secondary sense amplifiers representative of the first memory cell and the second memory cell to the third decoder means in response to a second portion of the second address of n signals.

12. A random access memory having a set of memory cells, comprising:
- first decoder means for selecting a first subset of memory cells from the set of all memory cells in response to a first signal;
- second decoder means for selecting a second subset of memory cells from the first subset of memory cells in response to a second signal;
- third decoder means for selecting a third subset of memory cells from the second subset of memory cells in response to a third signal; and
- fourth decoder means for selecting a fourth subset of memory cells from the third subset of memory cells in response to a fourth signal or a fifth subset of the memory cells from the third set of memory cells in response to a fifth signal and the fourth signal, said fifth subset disjoint form said fourth subset.

13. The memory of claim 12 wherein the set of memory cells is divided into a first array and a second array wherein said memory cells are characterized as being coupled to word lines and bit lines at intersections thereof, wherein the first decoder comprises:
- a first row decoder for enabling a word line in the first array selected by the first signal;
- a second row decoder for enabling a word line in the second array selected by the first signal, wherein the cells coupled to the word lines enabled by the first and second decoders comprise the first subset of memory cells;
- first sense amplifier means, coupled to the second decoder, for latching data stored in the memory cells coupled to the enabled word line in the first array; and
- second sense amplifier means, coupled to the second decoder, for latching data stored in the memory cells coupled to the enabled word line in the second array.

14. The memory of claim 13, wherein the second decoder means selects the first and second memory cells by coupling data of the first and second memory cells which is latched in the first and second sense amplifier means from the first and second sense amplifier means to the third decoder means in response to the second signal.

15. The memory of claim 14, wherein the second decoder means comprises:
- a plurality of secondary sense amplifiers for receiving selected data from the first and second sense amplifier means and providing outputs to the third decoder means;
- a column decoder for coupling data representative of the second subset of memory cells from the first and second sense amplifier means to the plurality of secondary sense amplifiers.

16. The memory of claim 15, wherein the third decoder means selects the third subset of memory cells by coupling selected outputs of the plurality of secondary sense amplifiers representative of the third subset of memory cells to the fourth decoder means.

17. The memory of claim 16 wherein the second and third signals are received after the first and fourth signals, further comprising:
- latch means for latching the first and fourth signals in in response to a row address strobe signal.

18. The memory of claim 12 wherein the second and third signals are receiving after the first and fourth signals, further comprising:
- latch means for latching the first and fourth signals in in response to a row address strobe signal.

19. A read/write memory having a set of memory cells in which a memory cell is selected by a first plurality of address signals, a second plurality of address signals, and a control address signal, comprising:
- selecting a first subset of memory cells in response to the first plurality of address signals;
- selecting a first memory cell and a second memory cell from the first subset of memory cells in response to the second plurality of address signals;
- selecting between the first memory cell and the second memory cell in response to an internal address signal; and
- reversing the selection between the first and second memory cell in response to an array toggle signal.

* * * * *